(12) United States Patent
Reit et al.

(10) Patent No.: US 12,071,533 B2
(45) Date of Patent: Aug. 27, 2024

(54) POLYMER SUBSTRATE DESIGN PARAMETERS FOR ELECTRONIC MICROFABRICATION

(71) Applicant: Ares Materials Inc., Dallas, TX (US)

(72) Inventors: Radu Reit, Carrollton, TX (US); Adrian Avendano-Bolivar, Plano, TX (US); David Arreaga-Salas, Garland, TX (US)

(73) Assignee: Ares Materials Inc., Dallas, TX (US)

( * ) Notice: Subject to any disclaimer, the term of this patent is extended or adjusted under 35 U.S.C. 154(b) by 1349 days.

(21) Appl. No.: 16/606,570

(22) PCT Filed: Apr. 13, 2018

(86) PCT No.: PCT/US2018/027654
§ 371 (c)(1),
(2) Date: Oct. 18, 2019

(87) PCT Pub. No.: WO2018/194936
PCT Pub. Date: Oct. 25, 2018

(65) Prior Publication Data
US 2021/0115258 A1    Apr. 22, 2021

Related U.S. Application Data

(60) Provisional application No. 62/488,410, filed on Apr. 21, 2017.

(51) Int. Cl.
*C08G 73/10* (2006.01)
*B05D 3/06* (2006.01)
(Continued)

(52) U.S. Cl.
CPC ............ *C08L 101/12* (2013.01); *B05D 3/067* (2013.01); *B05D 3/12* (2013.01);
(Continued)

(58) Field of Classification Search
CPC ....... C08G 73/1028; C08G 59/50; G02F 1/09; G02F 1/133302; G02F 1/133305;
(Continued)

(56) References Cited

U.S. PATENT DOCUMENTS 3,769,245 A     10/1973   Stewart et al.
2003/0122111 A1*  7/2003  Glatkowski .......... C09D 179/08
                                              423/447.2

(Continued)

FOREIGN PATENT DOCUMENTS

JP          2001261758 A  *  9/2001

OTHER PUBLICATIONS

Saidi-Amroun et al, "Measured and simulated transient current in polyethylene terephthalate films below and above the glass transition temperature," Proceedings of the 2004 IEEE International Conference on Solid Dielectrics, 2004. ICSD 2004., Toulouse, France, 2004, pp. 137-140 vol. 1. (Year: 2004).*

(Continued)

*Primary Examiner* — A. Dexter Tugbang
(74) *Attorney, Agent, or Firm* — McGuire Woods LLP

(57) ABSTRACT

Provided are methods for selecting a polymer for use as a flexible electronics substrate. An example method includes selecting a thermosetting polymer from a plurality of polymers, wherein the thermosetting polymer: undergoes a thermomechanical transition at a transition temperature between room temperature and the highest temperature observed during processing from the glassy to the rubbery regime; wherein the thermosetting polymer has a Young's modulus below 3 GPa in the glassy regime and wherein the thermosetting polymer has a Young's modulus above 0.3 MPa in the rubbery regime. The method further includes producing a flexible electronic substrate from the selected polymer.

11 Claims, 1 Drawing Sheet

(51) Int. Cl.
  *B05D 3/12* (2006.01)
  *C08L 101/12* (2006.01)
  *G02F 1/1333* (2006.01)
  *G03F 7/09* (2006.01)
  *H01L 27/12* (2006.01)

(52) U.S. Cl.
  CPC .......... *G02F 1/133305* (2013.01); *G03F 7/09* (2013.01); *H01L 27/1218* (2013.01); *H01L 27/1262* (2013.01); *C08G 73/1028* (2013.01); *C08L 2203/20* (2013.01)

(58) Field of Classification Search
  CPC ....... B05D 3/067; B05D 3/12; H01L 27/1218; H01L 27/1262; C08L 101/12; C08L 2203/20; G03F 7/09
  See application file for complete search history.

(56) References Cited

U.S. PATENT DOCUMENTS

| | | | |
|---|---|---|---|
| 2004/0223095 A1 | 11/2004 | Tsubata et al. | |
| 2004/0265490 A1 | 12/2004 | Yang et al. | |
| 2005/0195354 A1 | 9/2005 | Doane et al. | |
| 2012/0001173 A1* | 1/2012 | Suzuki ................ | H01L 27/1218 438/151 |
| 2012/0052268 A1 | 3/2012 | Axisa et al. | |
| 2012/0136125 A1* | 5/2012 | Rousseau ............... | C08G 59/50 525/523 |
| 2013/0253086 A1 | 9/2013 | Wilson et al. | |
| 2014/0099848 A1* | 4/2014 | Mather ................. | C08G 18/10 424/70.2 |
| 2016/0369055 A1* | 12/2016 | Leng ................. | C08G 73/1028 |

OTHER PUBLICATIONS

International Search Report dated Jul. 11, 2018 issued in related international application No. PCT/US2018/027654.

Scaggs "Thermosets vs. Thermoplastics: As Explained by Party Trash" (Aug. 10, 2014) (Source: https://www.polymersolutions.com/blog/thermosets_thermoplastics/Retrieved: Jun. 17, 2018 (Jun. 17, 2018)) p. 2, para 3.

Kandil et al. "Thermal behaviour of polyurethane for use in solar cell encapsulation" Solar Energy Materials, 1989; 19(3-5):211-219 (doi: 10.1016/0165-1633(89)90007-5) abstract.

Huang et al. "Roll-to-Roll Processing of Flexible Heterogeneous Electronics with Low Interfacial Residual Stress" IEEE Transactions on Components, Packaging and ManufacturingTechnology, 2011; 1(9):1368-1377 (doi: 10.1109/TCPMT.2011.2157692) p. 1376, col. 2, para 2-3.

* cited by examiner

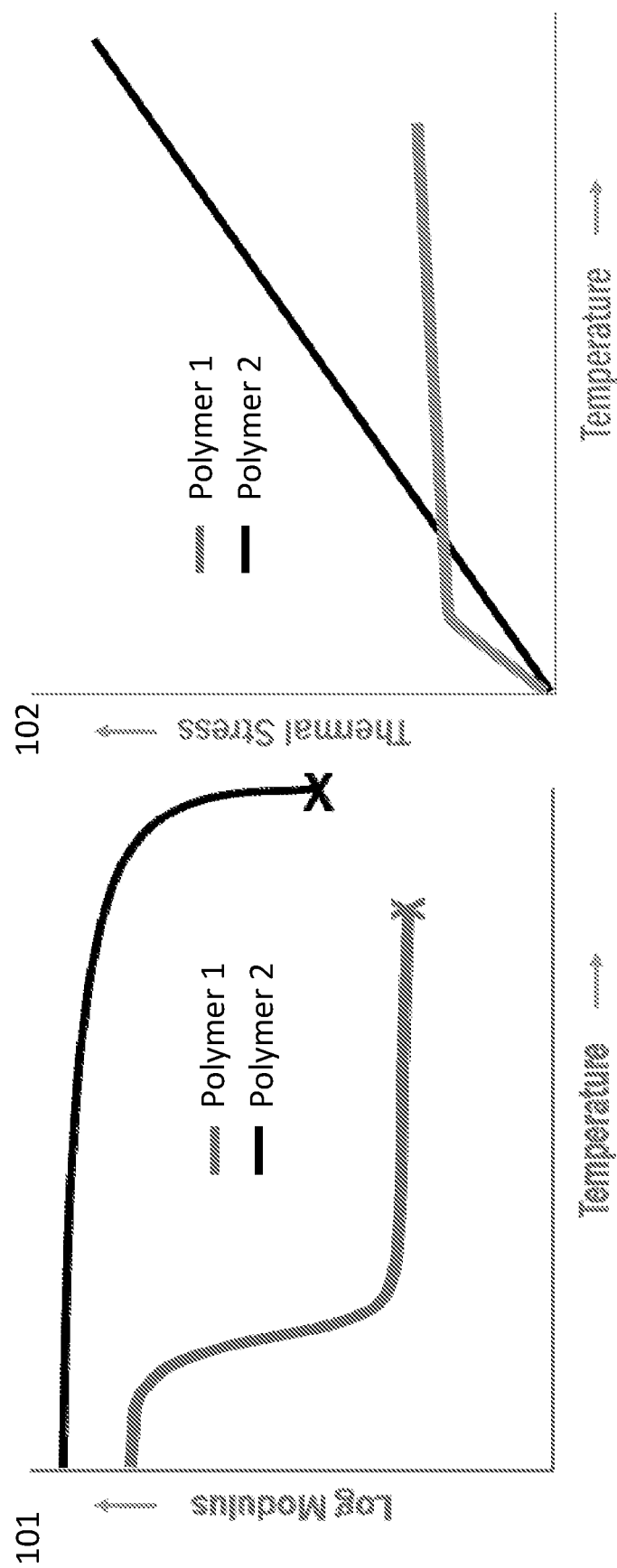

POLYMER SUBSTRATE DESIGN PARAMETERS FOR ELECTRONIC MICROFABRICATION

BACKGROUND

The fabrication of thin film electronics on polymer substrates is a goal that has gained great importance in the last few years. The possibility of using large area microfabrication techniques on polymer substrates may allow for the fabrication of cheaper, lighter, thinner and more rugged electronics.

Materials such as biaxially-oriented polyethylene naphthalate (hereafter "BOPEN"), biaxially-oriented polyethylene terephthalate (hereafter "BOPET"), and highly heat-resistant films such as polyimides (hereafter "PIs"), may comprise a low coefficient of thermal expansion (hereafter "CTE") and high glass or melt transition temperatures (hereafter "Tg" and "Tm" respectively). The CTE dictates the mechanical mismatch between materials deposited on top of the substrate and may indicate how much thermal-cycling related stress can be tolerated at the interface between the substrate and subsequent films. Additionally, slight polymer chain motion below the Tg or crystalline melt below the Tm may lead to irreversible deformations in the films subjected to multiple temperature cycles in the microfabrication process. These deformations may make processing impossible due to misalignment with previously deposited layers. Similarly, the Tg or Tm may dictate the maximum operating temperature the substrate can be subjected to before the permanent dimensional change renders it unprocessable. These two properties may be used to predict the mechanical behavior of thin-films on polymer substrates. As such, these properties aid in the selection of polymer substrates employed in a commercial microfabrication line. However, while these example materials with high glass or melt transition temperatures may be used as polymer substrates, they may still possess several drawbacks that precludes their use in a cheap, high-yield manner.

For example, it may be difficult to scale up microfabrication techniques with the aforementioned polymer substrates because of the requisite high solvent-fraction resins, long and delicate curing schedules (e.g., >7 hours with specially tuned ramp rates to prevent rapid solvent boiling), elevated temperatures (e.g., >400° C.) in order to remove said solvents and imidize the film, high internal stresses formed during the curing, and poor adhesion between the carrier substrate and the PI film on top.

BRIEF SUMMARY

In an embodiment, a method for selecting a polymer for use as a flexible electronics substrate is provided. The method comprises selecting a thermosetting polymer from a plurality of polymers, wherein the thermosetting polymer: undergoes a thermomechanical transition at a transition temperature between room temperature (i.e., 25° C.) and the highest temperature observed during processing from the glassy to the rubbery regime; wherein the thermosetting polymer has a Young's modulus below 3 GPa in the glassy regime and wherein the thermosetting polymer has a Young's modulus above 0.3 MPa in the rubbery regime. The method further comprises producing a flexible electronic substrate from the selected polymer.

Additionally or alternatively, the method may include one or more of the following features individually or in combination: the flexible electronic substrate may be used in a microfabrication process selected from the group consisting of deposition, etching, patterning, cleaning, or bonding step, or any combination thereof; the transition temperature may be the melting point of the thermosetting polymer; the transition temperature may be the glass transition temperature of the thermosetting polymer; the thermosetting polymer may have a CTE above 50 ppm/° C. at any temperature of the microfabrication process; the thermosetting polymer may have a cross-link density between about 0.01 mol/L and about 50 mol/L; the thermosetting polymer may be capable of being used in the microfabrication process at a temperature higher than the glass transition temperature of the thermoset polymer; the flexible electronic substrate may be used in a microfabrication process to produce transistors, capacitors, sensors, and color filters; the method may further comprise depositing thin film materials on the flexible electronic substrate wherein the thin film materials are deposited using a process selected from the group consisting of electron beam evaporation, molecular beam epitaxy, reactive ion sputtering, pulsed laser deposition, atomic layer deposition, chemical vapor deposition, electroplating, spin coating, and any combination thereof; the method may further comprise patterning the thin film materials on the flexible electronic substrate using a process selected from the group consisting of photolithography, ink printing, screen printing, shadow masking, and any combination thereof; the total internal tensile stress of the polymer may be below 25 MPa.

BRIEF DESCRIPTION OF THE DRAWINGS

The following FIGURES are included to illustrate certain aspects of the present disclosure and should not be viewed as exclusive embodiments. The subject matter disclosed is capable of considerable modifications, alterations, combinations, and equivalents in form and function, without departing from the scope of this disclosure.

FIG. 1 illustrates a generalized comparative example between Polymer 1 and Polymer 2. Graph 101 is a Log-linear example plot representing the relationship between the Young's modulus and temperature for low transition temperature polymers (Polymer 1) and typical substrates used for flexible electronics with high transition temperatures (Polymer 2). The thermal degradation temperatures are represented by 'X's. Graph 102 illustrates the total thermal stress in thin-films deposited atop each substrate as a function of temperature.

DETAILED DESCRIPTION

Embodiments comprise polymer films having a lower $T_g$ and/or $T_m$ than the maximum operating temperature of a microfabrication process which may range between 200° C. and 500° C. for some polymer films, as well as a higher coefficient of thermal expansion (hereafter "CTE") compared to currently used substrates for flexible electronics, for example, PIs may have CTE's of 8-50 ppm/° C. and BOPEN may have CTE's of 18-22 ppm/° C. These polymer substrates may incur relatively lower thermal-cycling induced stresses during thin-film deposition processes. Without limitation by theory, the primary mechanism behind this stress reduction may be related to a lowered Young's modulus of the polymer substrate and the thermomechanical transition temperature being in a range between room temperature and the maximum operating temperature; potentially further reducing the Young's modulus and further lowering the thermal-cycling stress accumulated at the interface. As used herein "flexible" refers to a material capable of possessing a non-zero curvature without breaking, cracking, or otherwise permanently degrading or deforming.

The polymer substrates described herein may be used in a microfabrication process to produce flexible electronics substrates. Embodiments of the polymer substrates comprise a low $T_g$ and/or Tm, a low Young's modulus before the transition temperature, an intermediate Young's modulus after the transition temperature, and a low internal cure-stress.

The principal consideration for deciding whether a polymer substrate is suitable for thin film deposition and subsequent photolithography is the total interfacial stress induced at the interface of the polymer substrate and the thin film. In the traditional mode of polymer substrate selection, a stiff polymer substrate with minimal mechanical property change as a function of the temperature cycling observed during fabrication (e.g., high thermomechanical transition temperatures) was selected. The interfacial stress of these stiff polymer substrates would be minimized by reducing the total thermal strain induced due to any CTE-related mismatch. However, this required using specific stiff polymer substrates capable of reduction in the CTE (e.g., aligned aromatic backbones, composites of polymers and negative-CTE materials, etc.), thereby limiting the pool of materials available for these processes. Overall this has resulted in a very limited selection of potential polymer substrate materials.

In embodiments, a new selection method is disclosed that selects for new polymer substrates from a plurality of polymer substrates based on the nonlinear, temperature-dependent mechanical properties of the substrate (e.g. thermomechanical transition temperatures between room temperature and the maximum processing temperature) allowing for the focus of the proposed substrate to be on the total stress accumulation between the substrate and the deposited thin film. As such, this section method may select substrates comprising CTE's higher than the substrates presently used in the field. Further, this selection method may select for polymer substrates comprising a lowered Young's modulus than the substrates presently used in the field, and for substrates comprising a thermomechanical transition between room temperature and the maximum operating temperature.

In the embodiments described herein, various polymers may be selected to serve as polymer substrates for use in microfabrication processes. General examples of the selected polymers comprise thermosetting materials with a Young's modulus below 3 GPa during the glassy regime and above 0.3 MPa during the rubbery regime. The polymers may undergo a thermomechanical transition from the glassy regime (the time prior to said thermomechanical transition) to the rubbery regime (the time after the thermomechanical transition) at lower temperatures than the polymers currently used in the art. Further, the polymers may be selected based on CTE's higher than the CTE's of the polymers currently used in the art. For example, the selected polymers may have CTE's greater than 50 ppm/° C. at any temperature present during the microfabrication process (e.g., about 150° C. to about 600° C.). With the benefit of this disclosure, one of ordinary skill in the art will be able to select a polymer substrate with a Young's modulus sufficient for a desired application.

The polymer substrates described herein may be selected because they possess a low $T_g$ or Tm. For example, the $T_g$ or Tm may be between 25° C. and 250° C. The $T_g$ or Tm can further be between 50° C. and 150° C. These values can be measured via their respective peaks in the tangent delta curve as given by a dynamic mechanical analyzer at 1 Hz. With the benefit of this disclosure, one of ordinary skill in the art will be able to select a polymer substrate with a $T_g$ or Tm sufficient for a desired application.

The polymer substrates described herein may be selected because they possess a CTE above 50 ppm/° C. at any temperature of the microfabrication process (e.g., about 150° C. to about 600° C.). For example, the CTE may be greater than 50 ppm/° C., greater than 60 ppm/° C., greater than 70 ppm/° C., greater than 80 ppm/° C., greater than 90 ppm/° C., greater than 100 ppm/° C., greater than 110 ppm/° C., greater than 120 ppm/° C., or greater than 130 ppm/° C. With the benefit of this disclosure, one of ordinary skill in the art will be able to select a polymer substrate with a CTE sufficient for a desired application.

As discussed below, the polymer substrate may undergo a thermomechanical transition before the maximum microfabrication temperature. As such, the polymer substrate may need to maintain a constant form factor (e.g., sheet, film, etc.) before and after the transition. Thermosetting polymers may maintain rigidity and thus, form, before and after the thermomechanical transition.

The polymer substrates described herein may be selected because they comprise a low Young's modulus. For a polymer substrate comprising a thickness of ~100 times larger than that of the thin films deposited atop, the stiffness of the polymer substrate should be no less than a ratio of 0.1 and no more than a ratio of 10 for a stack of materials which can be handled at about 25° C. As an example, if the thin film is a silicon nitride film having a thickness of 250 nm and a Young's modulus of 230 GPa, the film would have a cross-sectional stiffness of 57.5 kN/m. In order for the polymer substrate material to fall within this stiffness range at a thickness 100 times that of the thin film (25 um), the Young's modulus of the polymer substrate should be between 23 and 0.23 GPa. As the thin film materials may vary in modulus and thickness, a practical range for the polymer substrates is recommended between 3 and 0.3 GPa for the glassy regime.

As discussed above, the polymer substrates described herein possess a Young's modulus in a practical range between about 3 GPa and about 0.3 GPa for the glassy regime. The Young's modulus may range from any lower limit to any upper limit and encompass any subset between the upper and lower limits. Some of the lower limits listed may be greater than some of the listed upper limits. One skilled in the art will recognize that the selected subset may require the selection of an upper limit in excess of the selected lower limit. Therefore, it is to be understood that every range of values is encompassed within the broader range of values. For example, the Young's modulus during the glassy regime may be about 0.3 GPa, about 0.6 GPa, about 0.9 GPa, about 1.2 GPa, about 1.5 GPa, about 1.8 GPa, about 2.1 GPa, about 2.5 GPa, or about 3.0 GPa. With the benefit of this disclosure, one of ordinary skill in the art will be able to select a polymer substrate with a Young's modulus sufficient for a desired application.

To prevent the effects of CTE-mismatch, the example polymer substrates may undergo a thermomechanical transition (e.g., a glass transition or melt transition) between about 25° C. and the maximum processing temperature that the polymer substrates experience during a microfabrication process. The maximum processing temperature of the microfabrication process may be observed during a deposition, etching, patterning, cleaning, bonding, or any combination thereof. For example, a maximum processing temperature may be observed during a semiconductor annealing process, wherein the entire flexible electronics device including the substrate polymer can reach temperatures between 250° C. and 600° C. Other maximum processing temperatures may be observed during a dielectric deposition process, wherein the entire flexible electronics device including the substrate polymer can reach temperatures between 150° C. and up to 400° C. Still other maximum processing temperatures may be observed during a bonding process, wherein the entire flexible electronics device including the substrate polymer can reach temperatures between 100° C. and up to 300° C. As the maximum process temperature varies with the desired microfabrication process, a practical range for the maximum processing temperature is recommended between about 100° C. to about 600° C.

In contrast to the selecting of potential polymer substrates having a lowered Young's modulus in the temperature range prior to the thermomechanical transition(s) (i.e., the glassy regime), once the polymer substrate transitions, the Young's modulus must not be too low or otherwise the thin film stresses accumulating at the interface of the polymer substrate and the thin film may induce undesirable mechanical deformation, for example, wrinkling, buckling, delamination, cracking, etc. While the low Young's modulus would not introduce a sufficient stress for failure of the thin film given a sufficiently robust adhesion, these small stresses may result in large deformation in the substrate itself if the Young's modulus of the material is too low, which could induce the deformations described above. Similar to the example provided above, the ratio of the stiffness of the thin film and the stiffness of the transitioned (i.e., the rubbery regime) polymer substrate should be no less than a ratio of 0.0001 and no more than a ratio of 0.1 for a stack of materials which can be handled at about 25° C. Using the above example, if the thin film is a silicon nitride film having a thickness of 250 nm and a Young's modulus of 230 GPa, the film's cross-sectional stiffness would be 57.5 kN/m. In order for the polymer substrate to fall within this stiffness target range at a thickness 100 times that of the thin film (25 um), the Young's modulus of the polymer substrate should be between 230 and 0.23 MPa. A practical range for this post-thermomechanical transition Young's modulus is between 300 MPa and 0.3 MPa, which is again dependent on the thin film stack deposited atop the substrate. The specific values of the substrate's post-transition modulus can be calculated from the ratios of the biaxial Young's moduli of the thin film and the substrate. The modulus of the substrate may be tuned as desired by adjusting the crosslinking density of the polymer substrate. The Young's modulus of the polymer substrate may increase with increasing crosslink density. In some embodiments, the thermosetting polymer used for the polymer substrate has a cross-link density between about 0.01 mol/L and about 50 mol/L.

The polymer substrates described herein may be selected because they comprise a Young's modulus in a range between about 300 MPa and about 0.3 MPa for the rubbery regime. The Young's modulus may range from any lower limit to any upper limit and encompass any subset between the upper and lower limits. Some of the lower limits listed may be greater than some of the listed upper limits. One skilled in the art will recognize that the selected subset may require the selection of an upper limit in excess of the selected lower limit. Therefore, it is to be understood that every range of values is encompassed within the broader range of values. For example, the Young's modulus during the rubbery regime may be about 0.3 MPa, about 1 MPa, about 10 MPa, about 50 MPa, about 100 MPa, about 150 MPa, about 200 MPa, about 250 MPa, or about 200 MPa. With the benefit of this disclosure, one of ordinary skill in the art will be able to select a polymer substrate with a Young's modulus sufficient for a desired application.

Special consideration should be given to polymer substrates which are processed from a pre-polymer solution and are cured atop a carrier substrate. For these polymerized materials, it is important to mention that the internal stresses which develop during the curing process have a great role in the use of the polymer substrate in microfabrication using the design mechanism described in this invention. As polymers cure directly atop a carrier substrate, the densification of the polymer network versus the liquid resin leads to a non-zero tensile stress intrinsic to the polymer film. This stress can add to any final curvature of the substrate and thin film stack after debonding from a carrier substrate. While the total curvature is dependent on the thickness of the film in relation to the substrate, given a certain film stress, the intrinsic film stress can increase the curvature of the stack if the film stress is elevated. Practically, the film stress should be kept as low as possible, with preference for polymers with intrinsic tensile film stresses below 25 MPa.

Oft-cited examples for understanding thin-film stresses which accumulate in multi-layer structures are the original Stoney formula for bi-material strips, as well as the countless modifications and expansions of this initial formula. In these calculations, the total stress observed by a thin-film ($\sigma_f$) for two substrates of equal dimensions reduces to a direct proportionality between the thin-film stress and the Young's modulus of the substrate ($\sigma_f \propto E_s$). With reference to FIG. 1, this relationship is reflected by the low $T_g$ and a model polymer substrate having a lowered glassy modulus as compared to the comparative example polyimides (i.e. Polymer 2). Polymer 1 is an example polymer selected by the process described herein and having the properties described herein as a result of said selection process. As illustrated, this selection process effectively translates to a lowered buildup of thermal stress in the thin-films deposited atop the polymer substrate (as illustrated in Graph 102). Despite the higher thermal stress ramp rate below Tg for Polymer 1, the transition from the glassy regime to the rubbery regime allows for a more attenuated thermal stress buildup at temperatures after the Tg. The rubbery regime may be differentiated from the glassy regime via the reduction in the modulus of the material after the glass transition of a polymer has been surpassed. This may be observed by a brief spike in the tangent delta, or the ratio of the loss to the storage modulus, after which the tangent delta returns to a lower, baseline value.

A polymer substrate with the aforementioned properties (Polymer 1) may be used in a microfabrication process to enable backplanes composed with thin film transistors (hereafter "TFTs") or diodes, either for light emitting (e.g., as used with OLEDs) or sensing. The thin-film formation is performed using a deposition process including, but not limited to, plasma enhanced chemical vapor deposition (hereafter "PECVD"), sputtering deposition, e-beam evaporation, thermal evaporation, atomic layer deposition, pulsed laser deposition, or a combination thereof. It may be important for some embodiments, that the deposition process does not induce wrinkling or cracking. Reduction of the effect of the CTE mismatch also leads to layer-to-layer alignment capabilities that can be done with, but not limited to, photolithography using an automatic stepper machine or a shadow mask alignment system.

In some embodiments, the polymer substrate may be produced from a thermosetting polymer. In specific embodiments, the thermosetting polymer is a thermosetting resin which may be cured via actinic radiation or other sufficient curing process. In other embodiments, the thermosetting polymer may be a thermoplastic precursor in solution, which may then be processed via any sufficient solution deposition method and further cured using any sufficient curing process, for example, electromagnetic or thermal radiation.

Electronic components may be disposed upon the formed thin-film. Examples of these electronic components may include, but are not limited to, transparent conductive oxide sheets, capacitors, resistors, transistors, application-specific integrated circuits (ASIC), a system-on-chip (SOC), a central processing unit, a graphical processing unit, a microcontroller, a wireless transceiver, a field-programmable gate array (FPGA), a digital signal processor (DSP), an analog-to-digital converter (ADC), a display row or column driver for active matrix backplanes, an amplifier, a photosensor, a pressure sensor, a temperature sensor, a surface-mount resistor, capacitor, or inductor, or a combination thereof.

In some embodiments, the polymer substrate may be formed upon a carrier. Examples of the carrier may include, but are not limited to, glass, silicon, metal foil, rigid plastic, or any combination thereof.

In some embodiments, a flexible display may be formed on the polymer substrate. The flexible display may be a flexible liquid crystal display, organic light emitting diode display, electrophoretic display, reflective display, quantum dot emissive display, or any combination thereof. The forming of the flexible display on the polymer substrate may include the direct deposition or later attachment of active pixel driving elements (e.g., TFTs), barrier layers (e.g., those comprising oxides, nitrides, and the like), color filtration elements (e.g., red, green, or blue pigmented or dyed resists), polarizing elements (e.g., aligned and iodine-filled polyvinyl alcohol), emissive elements (e.g., organic light emitting diodes, quantum dots), reflective elements (e.g., electrophoretic ink-filled particles), adhesives (e.g., optically clear adhesives), cover lenses (e.g., hard coats), or any combination thereof.

In some embodiments, an electronic component may disposed atop the polymer substrate. The disposing of an electronic component atop the polymer substrate may comprise fabricating the electronic component atop the polymer substrate via photolithography, shadow mask lithography, ink-jet printing, screen printing, or any other subsequent additive and subtractive processes which yield a functional electronic component atop the polymer substrate. In alternative embodiments, prefabricated electronic components may be placed atop the polymer substrate using surface mount interfaces such as flip chip bonding, wire bonding, thermosonic bonding, solder paste printing and reflow, ultrasonic welding, the like, or any combination thereof.

EXAMPLE 1

A polymer resin is deposited via slot die coating at a target thickness of 50 um atop a glass carrier and is cured resulting in a tensile cure stress below 20 MPa. The resin is cured using UV radiation resulting in an amorphous thermoset polymer substrate (50 um thick) with a Tg of about 55° C., a glassy Young's modulus of about 2 GPa and a rubbery Young's modulus of about 30 MPa. Subsequently, thin film transistors are manufactured atop this substrate using a commercial stepper for aligning in between photolithography steps. The materials are deposited between 100° C. and 250° C., temperatures under which the substrate is above its glass transition temperature in a rubbery state. The substrate is resilient to the different chemicals used in this process, such as acids, bases and solvents. Once the thin film transistors are fabricated, the substrate can then be released via pulling using a mechanical method. As the substrate has very low built-up thermal stress and low inherent curing stress, there is a bending radius of 7 m, resulting in low compressive stresses in the devices fabricated on top.

EXAMPLE 2

The process like the one above wherein the devices fabricated on top are the layers necessary for a color filter to be used in the front plane of a display.

EXAMPLE 3

The process of Example 1 wherein the devices fabricated are indium gallium zinc oxide (hereafter "IGZO") TFTs. This process includes using a layer of 50 nm of molybdenum deposited via sputtering at room temperature (25° C.) and then patterned with photolithography to form a gate contact. Then PECVD is used to deposit 200 nm of $Si_3N_4$ at 250° C. (above the substrate's Tg) for its use as a gate dielectric and patterned after aligning with a stepper machine to the layer at the bottom. 50 nm of IGZO is sputtered and patterned as a semiconductor using a process temperature of 25° C. For metal contacts, a bilayer of Ti/Al is deposited at room temperature by sputtering and patterned. Then, 200 nm of $Si_3N_4$ at 250° C. is deposited by PECVD as a passivation and encapsulation layer, and photolithography is used to open vias and access the devices for their measurement.

The invention claimed is:

1. A method for selecting a polymer for use as a polymer substrate, the method comprising:
    selecting a thermosetting polymer from a plurality of polymers, wherein the thermosetting polymer:
        undergoes a thermomechanical transition at a transition temperature between 25° C. and a highest temperature observed during processing from a glassy regime to a rubbery regime; wherein the thermosetting polymer has a Young's modulus below 3 GPa in the glassy regime and wherein the thermosetting polymer has a Young's modulus above 0.3 MPa in the rubbery regime;
    producing the polymer substrate from the selected polymer, and
    depositing at least one thin film material on the polymer substrate, wherein an intrinsic tensile film stress of each of the at least one thin film material is below 25 MPa.

2. The method of claim 1, wherein the polymer substrate is used in a microfabrication process selected from the group consisting of deposition, etching, patterning, cleaning, bonding, and any combination thereof.

3. The method of claim 2, wherein the thermosetting polymer has a coefficient of thermal expansion above 50 ppm/° C. at any temperature of the microfabrication process.

4. The method of claim 2, wherein the thermosetting polymer comprises a glass transition temperature; wherein the thermosetting polymer is capable of being used in the microfabrication process at a temperature higher than the glass transition temperature of the thermosetting polymer.

5. The method of claim 1, wherein the transition temperature is a melting point of the thermosetting polymer.

6. The method of claim 1, wherein the transition temperature is a glass transition temperature of the thermosetting polymer.

7. The method of claim 1, wherein the thermosetting polymer has a cross-link density between about 0.01 mol/L and about 50 mol/L.

8. The method of claim 1, wherein the polymer substrate is used in a microfabrication process to produce transistors, capacitors, sensors, color filters, or a combination thereof.

9. The method of claim 1, wherein the at least one thin film material is deposited using a process selected from the group consisting of electron beam evaporation, molecular beam epitaxy, reactive ion sputtering, pulsed laser deposition, atomic layer deposition, chemical vapor deposition, electroplating, spin coating, and any combination thereof.

10. The method of claim 9, further comprising patterning the at least one thin film material on the polymer substrate using a process selected from the group consisting of photolithography, ink printing, screen printing, shadow masking, and any combination thereof.

11. The method of claim 1, wherein the total internal tensile stress of the thermosetting polymer is below 25 MPa.

\* \* \* \* \*